United States Patent
Krueger et al.

(10) Patent No.: US 8,854,862 B2
(45) Date of Patent: Oct. 7, 2014

(54) DEVICE FOR STORING A FREQUENCY AND METHOD FOR STORING AND READING OUT A FREQUENCY

(71) Applicant: Robert Bosch GmbH, Stuttgart (DE)

(72) Inventors: Veronique Krueger, Stuttgart (DE); Stefan Noll, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/679,546

(22) Filed: Nov. 16, 2012

(65) Prior Publication Data

US 2013/0128652 A1     May 23, 2013

(30) Foreign Application Priority Data

Nov. 17, 2011 (DE) .......................... 10 2011 086 519

(51) Int. Cl.
*G11C 13/00* (2006.01)
(52) U.S. Cl.
CPC .................................. *G11C 13/0069* (2013.01)
USPC .. 365/148; 365/189.05; 365/207; 365/189.08

(58) Field of Classification Search
CPC ........... G11C 13/0069; G11C 13/0004; G11C 13/0007
USPC ........................ 365/148, 189.05, 207, 189.08
See application file for complete search history.

(56) References Cited

U.S. PATENT DOCUMENTS

| | | | |
|---|---|---|---|
| 3,933,046 A | | 1/1976 | Ebrecht |
| 4,626,922 A | * | 12/1986 | Saitoh ............................ 358/466 |
| 5,644,270 A | | 7/1997 | Moyer et al. |
| 2012/0011092 A1 | * | 1/2012 | Tang et al. ....................... 706/33 |
| 2012/0127780 A1 | * | 5/2012 | Strachan et al. ............... 365/148 |

OTHER PUBLICATIONS

Pershin et al., Practical Approach to Programmable Analog Circuits with Memristors; IEEE Transactions on Circuits and Systems I: Regular Papers, IEEE, Aug. 2010, pp. 1857-1864, vol. 57, Issue 8.

* cited by examiner

*Primary Examiner* — Connie Yoha
(74) *Attorney, Agent, or Firm* — Maginot, Moore & Beck

(57) ABSTRACT

The disclosure relates to a device for storing a frequency, wherein the device comprises (i) a comparator having an input, an output, a supply voltage input, and a supply voltage output, and (ii) a memristor connected between the input and the comparator and the output of the comparator.

6 Claims, 3 Drawing Sheets

DEVICE FOR STORING A FREQUENCY AND METHOD FOR STORING AND READING OUT A FREQUENCY

This application claims priority under 35 U.S.C. §119 to German patent application no. DE 10 2011 086 519.5, filed Nov. 17, 2011 in Germany, the disclosure of which is incorporated herein by reference in its entirety.

BACKGROUND

The present disclosure relates to a device for storing a frequency, to a method for storing a frequency in the device, furthermore to a method for reading out a stored frequency from the device, and to a method for operating a device for storing, and to a corresponding computer program product.

A memristor is a passive electrical component in which a change in its electrical resistance can be brought about by means of a DC current signal. In the case of an AC current signal above a limit frequency, by contrast, the resistance remains constant.

Yurly V. Pershin and Massimilano Di Ventra, in their publication "Practical Approach to Programmable Analog Circuits with Memristors", IEEE Transactions on Circuits and Systems I: Regular Papers, Vol. 57, No. 8, August 2010, present various possibilities for using memristors in electrical circuits. In the circuits, the memristor is supplied with a DC current signal in each case by means of an autonomous supply unit, in order to change the resistance of the memristor.

SUMMARY

Against this background, the present disclosure presents a device for storing a frequency, a method for storing a frequency in the device, furthermore a method for reading out a stored frequency from the device, and a method for operating a device for storing, and finally a corresponding computer program product. Advantageous configurations are evident from the following description.

The disclosure is based on the insight that a memristor as oscillation frequency-determining element of an oscillatory circuit, by means of a frequency signal impressed on the circuit externally, experiences a change which adapts an oscillation frequency of the circuit to the impressed frequency signal. The oscillation frequency of the circuit changed in this way does not change after an interruption of the impressed frequency signal and after an interruption of a supply voltage of the circuit. An item of information about the oscillation frequency can thus be stored in the memristor.

The present disclosure provides a device for storing a frequency, wherein the device comprises the following features (i) a comparator having an input and an output, and also a supply voltage input and a supply voltage output; and (ii) a memristor connected between the input of the comparator and the output of the comparator.

A comparator can be understood to be an electronic circuit that compares two voltages. If a first voltage is higher than a second voltage, a first signal is present at an output of the comparator; in the opposite case, a second signal is present at the output. A memristor can be understood to be a component which has an ohmic resistance which changes in the case of a constant energization. The resistance remains constant during operation with high-frequency AC current without a DC current component.

The comparator can have a second input, and a resistor can be connected between the second input and the output of the comparator. A resistor can be understood to be an ohmic resistor. The device can comprise a capacitance connected between a potential terminal and one of the two inputs of the comparator. A capacitance can be understood to be a capacitor. The device can comprise a further resistor connected between a further potential terminal and the input of the comparator. By means of further components, the device can be extended to form an independently oscillatory resonant circuit. The comparator can switch back and forth between two voltage states. The capacitance in combination with the resistors acts as a delay in order to set a finite oscillation frequency. By means of changes of the delay elements, it is possible to achieve a different time constant between the alternation of the two states. A pulse source can be connected between the further potential terminal and the further resistor and/or the input of the comparator. A pulse source can be designed to provide an oscillation frequency having a predetermined frequency. The oscillation signal can influence the oscillatory resonant circuit. An oscillation of the oscillatory resonant circuit and the oscillation signal can be superposed to form a mixed signal. The mixed signal can have a DC current component which can change an item of information about the frequency stored in the memristor. The information can be changed until the oscillation of the device oscillates with the frequency of the oscillation signal.

The present disclosure furthermore provides a method for storing a frequency in a device for storing according to the approach presented here, wherein the method comprises the following step (i) applying to the device a write signal having a frequency to be stored, in order to store an item of information corresponding to the frequency in the memristor.

A write signal can be understood to be a frequency-stable signal which is provided by a signal source. In the oscillatory circuit of the device, it is possible to change an initial oscillation prior to application of the write signal to form a mixed oscillation having a signal superposition of initial oscillation and write signal. The mixed oscillation can have a DC current component. The DC current component can change the in information about the frequency stored in the memristor until the circuit oscillates in time with the write signal.

Furthermore, the present disclosure provides a method for reading out a stored frequency from a device for storing according to the approach presented here, wherein the method comprises the following step (i) energizing the comparator with a supply voltage by means of the supply voltage input and the supply voltage output, in order to tap off a read-out signal in order to read out an item of information corresponding to the frequency.

A read-out signal can be understood to be a natural oscillation of the device that is defined by the memristor. The natural oscillation can be excited by the supply voltage of the comparator.

The present disclosure furthermore provides a method for operating a device for storing according to the approach presented here, wherein the method comprises at least the following steps (i) the step of a method for storing a frequency according to the approach presented here; and (ii) the step of a method for reading out a frequency according to the approach presented here.

The method can comprise a step of resting, which takes place between the steps of storing and the steps of reading-out, wherein, in the step of resting, nothing is applied to the device and the device is not energized and the information corresponding to the frequency is retained. After the step of resting, the device can once again be operated with the stored frequency. As a result, the device can store the information about the frequency without an energy requirement.

Also advantageous is a computer program product comprising program code which can be stored on a machine-readable carrier such as a semiconductor memory, a hard disk storage device or an optical storage device and is used for carrying out or driving the steps of the method according to any of the embodiments described above if the program is executed on a computer or a device.

BRIEF DESCRIPTION OF THE DRAWINGS

The disclosure is explained in greater detail below by way of example with reference to the accompanying drawings, in which.

DETAILED DESCRIPTION

In the following description of preferred exemplary embodiments of the present disclosure, identical or similar reference signs are used for the elements acting in a similar way that are illustrated in the different figures, a repeated description of said elements being dispensed with.

Figure 1:
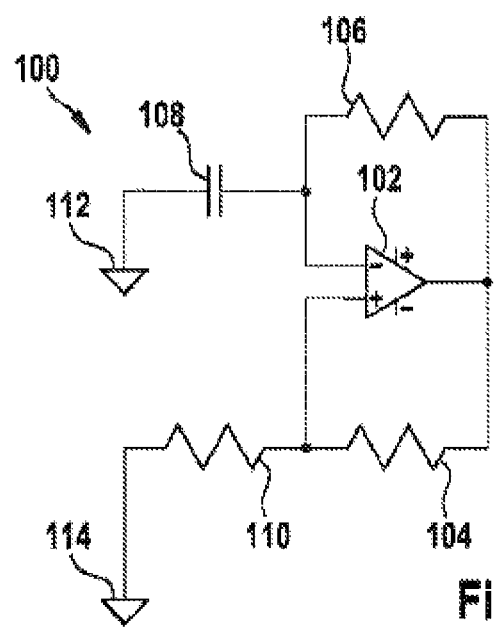
FIG. 1 shows a circuit diagram of a device for storing in accordance with one exemplary embodiment of the present disclosure.

FIG. 1 shows a circuit diagram of a device for storing 100 a frequency in accordance with one exemplary embodiment of the present disclosure. The device 100 comprises a comparator 102, a memristor 104, a resistor 106, a capacitance 108 and a further resistor 110. The comparator 102 has an inverting input −, a non-inverting input + and an output. Furthermore, the comparator has a negative terminal and a positive terminal for a supply voltage. The memristor 104 has two terminals. The first terminal of the memristor 104 is connected to the non-inverting input + of the comparator 102. The second terminal of the memristor 104 is connected to the output of the comparator 102. The resistor 106 likewise has two terminals. The first terminal of the resistor 106 is connected to the inverting input − of the comparator 102. The second terminal of the resistor 106 is connected to the output of the comparator 102 and the second terminal of the memristor 104. The capacitance 108, a capacitor, has two terminals. The first terminal of the capacitance 108 is connected to a first potential terminal 112 of the device 100. The second terminal of the capacitance 108 is connected to the inverting input − of the comparator 102 and the first terminal of the resistor 106. The further resistor 110 has two terminals. The first terminal of the further resistor 110 is connected to a second potential terminal 112 of the device 100. The second terminal of the further resistor 110 is connected to the non-inverting input + of the comparator 102 and the first terminal of the memristor 104. During operation, the negative terminal and the positive terminal of the comparator 102 are connected to a voltage source for the supply voltage, which is not illustrated.

Figure 2:
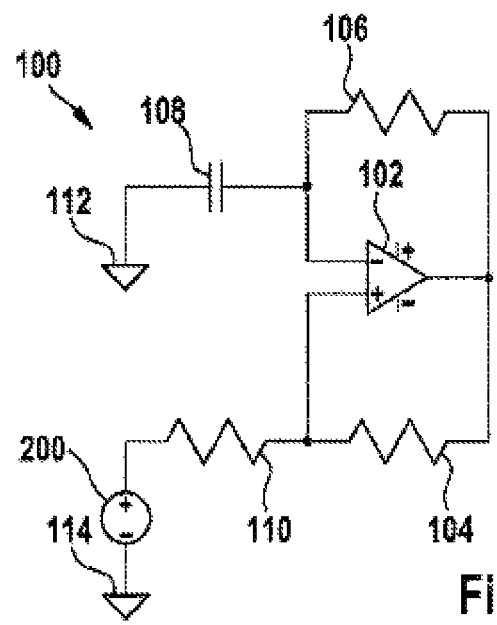
FIG. 2 shows a circuit diagram of a device for storing in accordance with a further exemplary embodiment of the present disclosure.

FIG. 2 shows a circuit diagram of a device for storing 100 in accordance with a further exemplary embodiment of the present disclosure. The device 100 corresponds to the device as illustrated in FIG. 1. In addition, in FIG. 2, a pulse source 200 is arranged between the second potential terminal 112 of the device 100 and the further resistor 110.

In other words, FIGS. 1 and 2 show a frequency memory 100 comprising a memristor 104. Memristors are a new type of electrical resistors. The resistance of a memristor is not constant, but rather can be programmed therein in a variable manner. A memristor is a resistor whose value is dependent on its past. If an AC current having a frequency higher than a specific limit frequency flows, its value does not change. If the frequency of the current is less than the limit frequency, the resistance changes. Consequently, the memristor 104 can be used as a memory, for example. The dimensions of memristors can be in the range of a few nanometers. Higher storage densities than with conventional memory technologies are thus possible. Other applications for this component are also possible in terms of circuitry. The approach presented here presents one possible circuit as to how a memristor 104 can be used for storing a "frequency".

Programmable frequency generators (PLL phase-locked loop) are programmable frequency dividers or frequency multipliers which can divide/multiply a reference frequency by an arbitrary factor. In combination with clock generators, arbitrary frequencies can be generated or tracking frequency generators can be constructed. In contrast to the frequency memory 100 presented here, a PLL generator is not self-running, i.e. it needs a further clock generator as source. In the case of a crystal oscillator, for example, a clock signal is generated by an oscillating quartz crystal. In this case, the frequency is set by the mechanical design or mechanical trimming. A bistable multivibrator is a comparator which changes back and forth periodically between the two output levels. This constitutes in practice the basic stage for all clock generators.

The frequency memory 100 is a circuit with which a "frequency" can be stored and read out again. For the purpose of programming, a signal having a frequency in a specific frequency range is applied to an input 114 of the circuit 100. A signal having the input frequency is then present at the output 112. If a signal below a specific limit frequency is applied (e.g. the input is grounded), the frequency of the output signal is retained. If the supply voltage is switched off, the value in the memory is retained. After application of the supply voltage, a signal having the programmed-in frequency is output again.

With the frequency memory 100 with memristor 104, a frequency can be directly stored and also directly read out again. It can be universally incorporated in further circuits which require a clock signal. A use in computation units is likewise possible. The frequency memory 100 likewise constitutes a possibility of using a memristor 104 as a memory location for efficiently storing data. Digital components can be used for reading the circuit 100 and for programming; therefore, this circuit can make the use of a process for analog circuit superfluous. The circuit 100 can be arranged on an integrated circuit.

The approach presented here is based on the connection of a programmable resistor 104 to a comparator 102. The resistor 104 is programmable by virtue of the fact that a current having a frequency below a limit frequency programs the resistor 104, and an AC current above the limit frequency leaves the resistor 104 unchanged. The resistor 104 charges and discharges a capacitor 108. The comparator 102 compares the charge value of the capacitor 108 with a lower value and respectively changes over between charging operation and discharging operation in order to achieve oscillating operation. At equilibrium, no DC current flows through the resistor 104. As a result of an imbalance at the input 114, a DC current is generated in the resistor 104, the electrical resistance value of which thereby changes and thus changes the total frequency of the system 100. Many drive circuits for memristors can be constructed according to this principle.

FIG. 1 and FIG. 2 show an example of a construction of a circuit 100 in accordance with an exemplary embodiment of the present disclosure. The basic construction corresponds to a bistable multivibrator. The memristor 104 is incorporated in the circuit 100 such that no DC current component flows through the component 104 in normal oscillator operation. If the circuit 104 oscillates with a higher frequency than the limit frequency of the memristor 104, the programmed-in value is retained and the resistance of the memristor 104 does not change. If AC current having a frequency greater than the specific limit frequency of the memory 104 flows, the latter behaves like a completely normal resistor. However, a negative current below the limit frequency reduces the resistance of the memristor 104. If the current is positive on average, the resistance thereof increases.

Figure 3:
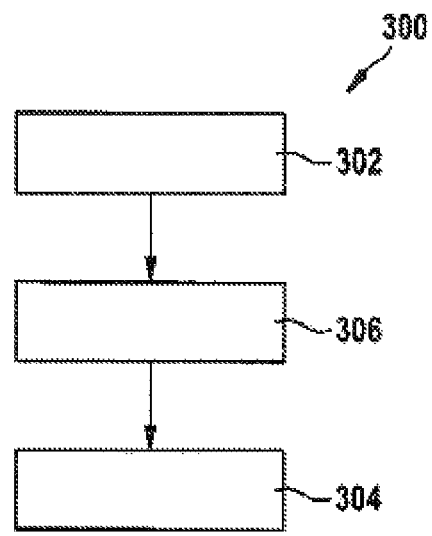
FIG. 3 shows a flow chart of a method for operating a device for storing in accordance with one exemplary embodiment of the present disclosure.

FIG. 3 shows a flow chart of a method for operating 300 a device for storing in accordance with one exemplary embodiment of the present disclosure. The method 300 comprises the step 302 of a method for storing, the step 306 of a method for reading out, and a step of resting 306.

The method for storing a frequency in accordance with one exemplary embodiment of the present disclosure comprises a step 302 of applying. In the step of applying, a write signal is applied to a memristor of a device for storing, as illustrated in FIG. 2, said signal having a frequency to be stored in order to store an item of information corresponding to the frequency in the memristor. The write signal can be provided, for example, by a pulse source as in FIG. 2. The write signal is superposed on a fundamental oscillation of the device. Upon superposition, a DC current component results which causes charge carriers to migrate in the memristor until a resistance of the memristor has changed to an extent such that the DC current component tends toward zero and a frequency of the fundamental oscillation corresponds to the frequency to be stored.

The method for reading out a stored frequency in accordance with one exemplary embodiment of the present disclosure comprises a step 304 of energizing. In the step of energizing, a comparator of a device for storing, as illustrated in FIG. 1 or FIG. 2 is energized with a supply voltage. The supply voltage is applied between the supply voltage input and the supply voltage output of the comparator. By means of the supply voltage, the device is excited to oscillation and a read-out signal can be tapped off in order to read out an item of information corresponding to the stored frequency.

In the step of resting 306, voltage and/or signals is/are not applied to the device. During resting, the device can store an item of information about the frequency to be stored in the written resistance of the memristor. After the step of resting 306, the information can be read out again by means of step 306 of the method for reading out.

Figure 4:
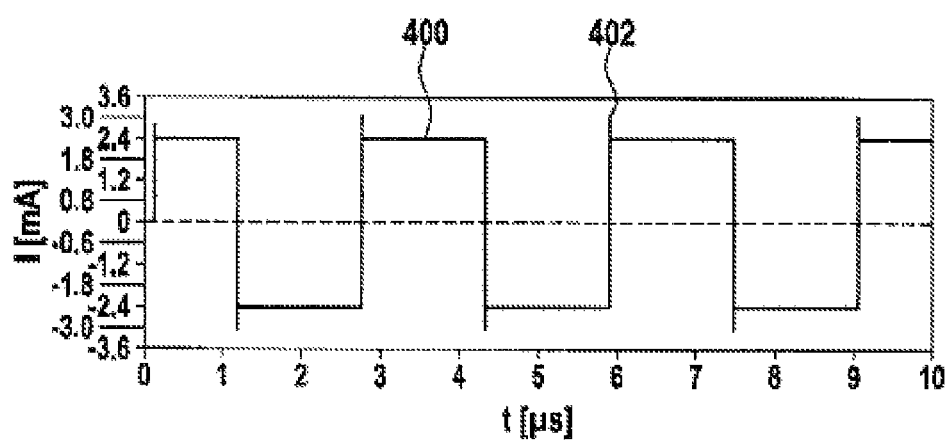
FIG. 4 shows a diagram of an oscillation signal of a device for storing in accordance with one exemplary embodiment of the present disclosure in an initial state.

During basic operation without an applied input signal, the multivibrator 100 oscillates like a normal clock generator. An AC current having a high frequency flows through the memristor 104; therefore, the resistance thereof remains constant. A measurement writing or signal value diagram of basic operation is shown in FIG. 4. The pulse source 200 is not connected to the input 114. The current through the memristor 104 is shown. The oscillator 100 oscillates with a constant frequency.

Figure 5:
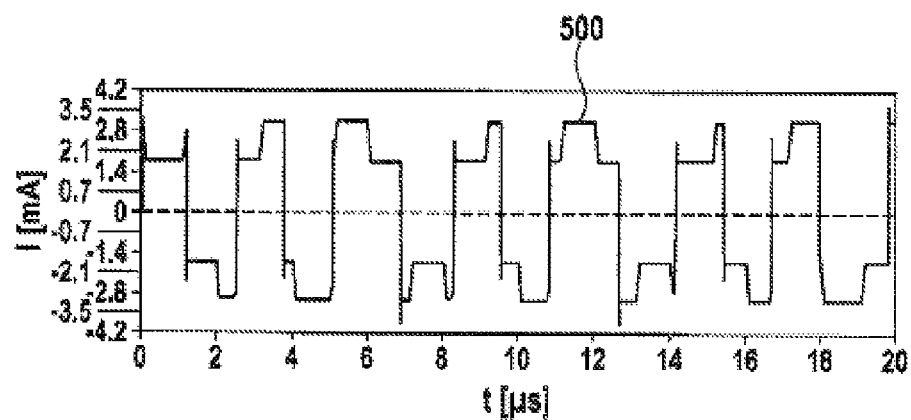
FIG. 5 shows a diagram of an oscillation signal of a device for storing in accordance with one exemplary embodiment of the present disclosure in a starting stage of storing.
Figure 6:
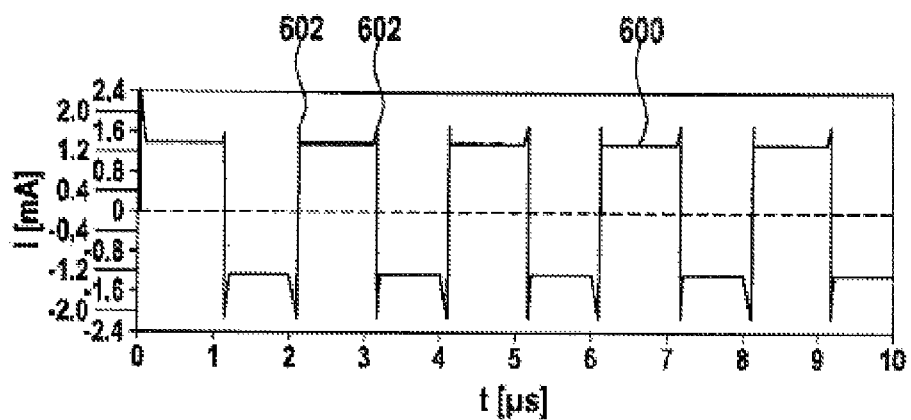
FIG. 6 shows a diagram of an oscillation signal of a device for storing in accordance with one exemplary embodiment of the present disclosure in an end stage of storing.
Figure 7:
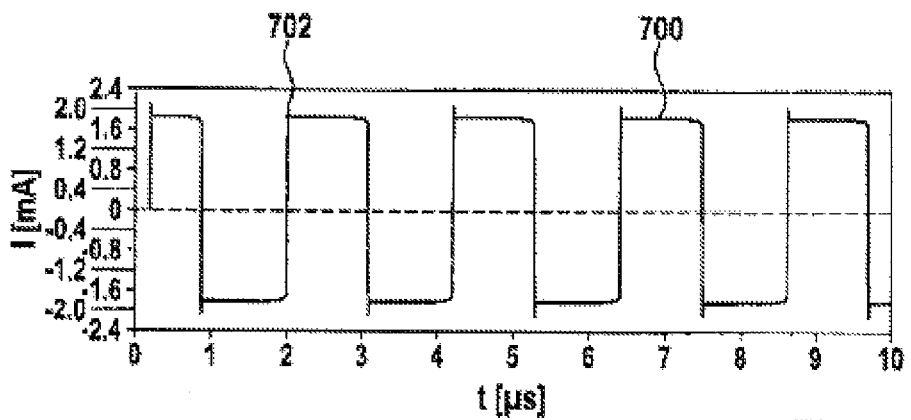
FIG. 7 shows a diagram of an oscillation signal of a device for storing in accordance with one exemplary embodiment of the present disclosure in an end state with stored information about the frequency in the memristor.

If a frequency is then applied to the input 114 of the circuit 100, the duty ratio of the oscillator changes. The pulse source 200 is connected to the input 114. The resonant circuit 100 is detuned, and the current signal which flows via the memristor 104 acquires a DC voltage component, as shown in FIG. 5. In the current it can then be discerned that the area above the zero line is greater than below the zero line. A DC current thus flows on average through the memristor 104 and increases the resistance thereof. This DC voltage component now changes the resistance of the memristor 104 until the DC voltage component corresponds to zero again, as shown in FIG. 6. The frequency is now programmed in. If the resistance of the memristor 104 has now increased from the value 0.5 k to the value 1 k, the current shown in FIG. 6 flows. A DC offset is no longer present; consequently, the resistance of the memristor 104 remains constant. If the pulse source 200 is disconnected from the circuit 100, the oscillator 100 continues to oscillate with the set frequency, as illustrated in FIG. 7.

The circuit 100 illustrated here is a basic circuit for memristors. Other driving arrangements for memristors could be modified by this circuit 100. Since a memristor can be read with AC voltage, corresponding read out circuits are required for applications with memristors. The frequency memory 100 presented here constitutes one possibility as to how reading can be effected. By way of example, memristors can be used in the fields of memories, neural networks, filters, classification and image recognition systems. Comparators can be developed from relatively simple transistors. With memristors in circuits according to the approach presented here, it is possible to construct highly compact memories with pure digital transistors.

FIGS. 4, 5, 6 and 7 show signal profile diagrams of different oscillation signals which were tapped off at the memristor of the device for storing as illustrated in FIGS. 1 and 2. A rising time in μs plotted on the abscissa of the signal profile diagrams. A current intensity in mA is plotted on the ordinate, the value 0 μA being represented by a dashed line.

FIG. 4 illustrates a timing diagram of an initial state during read-out operation of the device for storing. The abscissa extends over a time range of 10 μs; values in the range of ±3.6 mA are plotted on the ordinate. The abscissa intersects the ordinate at −3.6 mA. In the initial state, the device oscillates with a rectangular signal 400 having an overshoot 402. The rectangular signal 400 has an amplitude of ±2.4 mA with an oscillation duration of approximately 3 μs. The rectangular signal 400 is symmetrical with respect to 0 mA. The rectangular signal has no DC current component.

FIG. 5 illustrates a timing diagram which was recorded at the beginning of application for programming while a write signal from the pulse source was superposed over the rectangular signal from FIG. 4. The abscissa extends over 20 μs; ±4.2 mA are plotted on the ordinate. The abscissa intersects the ordinate at −4.2 mA. The device is visibly detuned. The superposed signal 500 has an irregular amplitude between approximately ±3 mA and an irregular oscillation duration of on average approximately 2.8 μs. The signal 500 has a DC current component which causes charge carriers to migrate within the memristor substrate in order to adapt the device such that it can oscillate harmonically again. In this case, the fundamental oscillation of the device changes until the fundamental oscillation corresponds to the impressed write signal.

FIG. 6 illustrates a timing diagram which was recorded at the end of application when the programming operation had been concluded. The abscissa extends over 100 μs; ±2.4 mA are plotted on the ordinate. The abscissa intersects the ordinate at −2.4 mA. The device oscillates harmonically again. The fundamental oscillation of the device is synchronous with the write signal of the pulse source. The resulting signal 600 no longer has a DC current component. The resistance of the memristor has been changed such that the frequency of the fundamental oscillation corresponds to the frequency of the write signal. The resulting signal 600 has a rectangular profile having two overshoots 602. The resulting signal 600 has an amplitude of approximately ±1.3 mA with an oscillation duration of approximately 2 μs.

FIG. 7 illustrates a timing diagram which was recorded after application for reading out the new state. The device, as shown in FIG. 1, oscillates freely again. The abscissa extends over 100 μs; ±2.4 mA are plotted on the ordinate. The abscissa intersects the ordinate at −2.4 mA. A shape of the oscillation 700 corresponds to the shape of the oscillation in FIG. 4. The oscillation 700 has a rectangular profile having an overshoot 702. The oscillation 700 has an amplitude of ±1.8 mA with an oscillation duration of approximately 2 μs.

The exemplary embodiments described and shown in the figures were chosen merely by way of example. Different exemplary embodiments can be combined with one another completely or with regard to individual features. Moreover, one exemplary embodiment can be supplemented by features of a further exemplary embodiment.

Furthermore, method steps according to the disclosure can be performed repeatedly and in a different order from that described.

If an exemplary embodiment comprises an "and/or" linkage between a first feature and a second feature, then this should be taken to mean that the exemplary embodiment comprises both the first feature and the second feature in accordance with one embodiment and comprises either only the first feature or only the second feature in accordance with a further embodiment.

What is claimed is:

1. A device for storing a frequency, comprising:
a comparator having an input, an output, a supply voltage input, and a supply voltage output; and a memristor connected between the input of the comparator and the output of the comparator, wherein the comparator has a second input, and wherein a resistor is connected between the second input and the output of the comparator; and a capacitance arranged conductively between a potential terminal and the second input of the comparator.

2. The device according to claim 1, further comprising:
a further resistor connected between a further potential terminal and the input of the comparator.

3. The device according to claim 2, further comprising:
a pulse source connected between the further potential terminal and the further resistor and/or the input of the comparator.

4. A method for operating a device for storing a frequency, the device including (i) a comparator having an input, an output, a supply voltage input, and a supply voltage output, and (ii) a memristor connected between the input of the comparator and the output of the comparator, the method comprising:
applying to the device a write signal having a frequency to be stored, in order to store an item of information corresponding to the frequency in the memristor; and
energizing the comparator with a supply voltage by means of the supply voltage input and the supply voltage output, in order to tap off a read-out signal in order to read out an item of information corresponding to the frequency.

5. The method according to claim 4, further comprising:
resting, which takes place between the steps of storing and the steps of reading out,
wherein, in the step of resting, nothing is applied to the device, the device is not energized, and the information corresponding to the frequency is retained.

6. A non-transitory, computer readable storage medium having program code stored thereon for execution by a processor and causing the processor to execute a method for operating a device for storing a frequency, the device including (i) a comparator having an input, an output, a supply voltage input, and a supply voltage output, and (ii) a memristor connected between the input of the comparator and the output of the comparator, the method comprising:
applying to the device a write signal having a frequency to be stored, in order to store an item of information corresponding to the frequency in the memristor, and
energizing the comparator with a supply voltage by means of the supply voltage input and the supply voltage output, in order to tap off a read-out signal in order to read out an item of information corresponding to the frequency.

* * * * *